United States Patent
Kao et al.

(10) Patent No.: US 11,211,243 B2
(45) Date of Patent: Dec. 28, 2021

(54) METHOD OF FILLING GAPS WITH CARBON AND NITROGEN DOPED FILM

(71) Applicant: Taiwan Semiconductor Manufacturing Company, Ltd., Hsinchu (TW)

(72) Inventors: Wan-Yi Kao, Baoshan Township (TW); Chung-Chi Ko, Nantou (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 229 days.

(21) Appl. No.: 16/529,098

(22) Filed: Aug. 1, 2019

(65) Prior Publication Data

US 2020/0161123 A1 May 21, 2020

Related U.S. Application Data

(60) Provisional application No. 62/770,424, filed on Nov. 21, 2018.

(51) Int. Cl.
*C23C 16/40* (2006.01)
*H01L 21/02* (2006.01)
(Continued)

(52) U.S. Cl.
CPC ........ *H01L 21/0228* (2013.01); *C23C 16/042* (2013.01); *C23C 16/045* (2013.01);
(Continued)

(58) Field of Classification Search
CPC ..... C23C 16/40; C23C 16/401; C23C 16/402; C23C 16/45525; C23C 16/325; C23C 16/345
See application file for complete search history.

(56) References Cited

U.S. PATENT DOCUMENTS

| 7,077,904 B2 | 7/2006 | Cho et al. |
| 7,288,145 B2* | 10/2007 | Xiao ........................ C07F 7/10 |
| | | 106/287.11 |

(Continued)

FOREIGN PATENT DOCUMENTS

| DE | 102017112820 A1 | 10/2018 |
| KR | 100468729 B1 | 1/2005 |

(Continued)

OTHER PUBLICATIONS

Burton, B.B, et al., "SiO2 Atomic Layer Deposition Using Tris(dimethylamino)silane and Hydrogen Peroxide Studied by in Situ Transmission FTIR Spectroscopy". J. Phys. Chem. C2009, vol. 113, No. 19, pp. 8249-8257.*

(Continued)

*Primary Examiner* — Bret P Chen
(74) *Attorney, Agent, or Firm* — Slater Matsil, LLP

(57) ABSTRACT

A method includes etching a semiconductor substrate to form a trench, and depositing a dielectric layer using an Atomic Layer Deposition (ALD) cycle. The dielectric layer extends into the trench. The ALD cycle includes pulsing Hexachlorodisilane (HCD) to the semiconductor substrate, purging the HCD, pulsing triethylamine to the semiconductor substrate, and purging the triethylamine. An anneal process is then performed on the dielectric layer.

20 Claims, 19 Drawing Sheets

(51) Int. Cl.
- *H01L 29/66* (2006.01)
- *H01L 29/78* (2006.01)
- *H01L 27/088* (2006.01)
- *C23C 16/455* (2006.01)
- *H01L 21/8234* (2006.01)
- *H01L 21/762* (2006.01)
- *C23C 16/56* (2006.01)
- *C23C 16/04* (2006.01)

(52) U.S. Cl.
CPC ...... *C23C 16/402* (2013.01); *C23C 16/45527* (2013.01); *C23C 16/45553* (2013.01); *C23C 16/56* (2013.01); *H01L 21/0214* (2013.01); *H01L 21/76224* (2013.01); *H01L 21/823431* (2013.01); *H01L 21/823481* (2013.01); *H01L 27/0886* (2013.01); *H01L 29/6681* (2013.01); *H01L 29/785* (2013.01)

(56) References Cited

U.S. PATENT DOCUMENTS

| | | | |
|---|---|---|---|
| 7,651,955 B2 * | 1/2010 | Ranish | C23C 16/45519 438/769 |
| 7,763,523 B2 | 7/2010 | Ahn et al. | |
| 9,611,544 B2 | 4/2017 | LaVoie et al. | |
| 10,535,555 B2 | 1/2020 | Wang et al. | |
| 10,546,786 B2 | 1/2020 | Yin et al. | |
| 10,867,841 B2 | 12/2020 | Hsiao et al. | |
| 2003/0203113 A1 | 10/2003 | Cho et al. | |
| 2004/0018694 A1 | 1/2004 | Lee et al. | |
| 2005/0158983 A1 * | 7/2005 | Hoshi | H01L 21/02211 438/623 |
| 2006/0090694 A1 * | 5/2006 | Cho | C23C 16/402 117/104 |
| 2009/0035917 A1 | 2/2009 | Ahn et al. | |
| 2009/0075490 A1 * | 3/2009 | Dussarrat | H01L 21/31612 438/787 |
| 2009/0275214 A1 | 11/2009 | Surthi | |
| 2013/0237064 A1 | 9/2013 | Kirikihira et al. | |
| 2014/0051262 A9 * | 2/2014 | Lavoie | H01L 21/0228 438/776 |
| 2014/0183657 A1 * | 7/2014 | Lim | H01L 29/4966 257/380 |
| 2014/0287596 A1 * | 9/2014 | Hirose | H01L 21/02219 438/786 |
| 2014/0346568 A1 * | 11/2014 | De Jaeger | H01L 29/7783 257/194 |
| 2015/0259791 A1 * | 9/2015 | Hausmann | H01L 21/02219 118/697 |
| 2016/0111272 A1 * | 4/2016 | Girard | C23C 16/24 438/770 |
| 2016/0115592 A1 * | 4/2016 | Vadadi | C23C 16/45514 118/728 |
| 2016/0314962 A1 * | 10/2016 | Higashino | C23C 16/401 |
| 2020/0161170 A1 * | 5/2020 | Kao | H01L 21/0228 |

FOREIGN PATENT DOCUMENTS

| | | |
|---|---|---|
| KR | 100866143 B1 | 10/2008 |
| KR | 20130137068 A | 12/2013 |
| KR | 20140071402 A | 6/2014 |
| KR | 20180068844 A | 6/2018 |

OTHER PUBLICATIONS

Mayangsari, Tirta R., et al., "Catalyzed Atomic Layer Deposition of Silicon Oxide at Ultralow Temperature Using Alkylamine". Langmuir 2018, 34, 6660-6669.*

Kim, Ki-Young, et al., "Initial Reaction of Hexachlorodisilane on Amorphous Silica Surface for Atomic Layer Deposition Using Density Functional Theory". Journal of the Korean Ceramic Society, vol. 54, No. 5, 2017, pp. 443-447.*

Ovanesyan, Rafaiel A., et al., "Atomic layer deposition of silicon-based dielectrics for semiconductor manufacturing: Current status and future outlook". J. Vac. Sci. Technol. A 37, 060904 (2019) pp. 1-22. https://doi.org/10.1116/1.5113631.*

Kessler, Fabian K., et al., "Functional carbon nitride materials—design strategies for electrochemical devices.". Nature Reviews Materials May 2017, pp. 1-16. DOI: 10.1038/natrevmats.2017.30.*

Ladva, Satyam A., et al., "Nanoscale, conformal films of graphitic carbon nitride deposited at room temperature: a method for construction of heterojunction devices". Nanoscale, 2017, 9, 16586-16590.*

Bian, Juncao, et al., "C=C p Bond Modified Graphitic Carbon Nitride Films for Enhanced Photoelectrochemical Cell Performance". Chem. Asian J. 2017, 12, 1005-1012.*

Jung, Yong Chan, et al., "Low Temperature Thermal Atomic Layer Deposition of Aluminum Nitride Using Hydrazine as the Nitrogen Source". Materials, 2020, 13, 3387, pp. 1-10.*

* cited by examiner

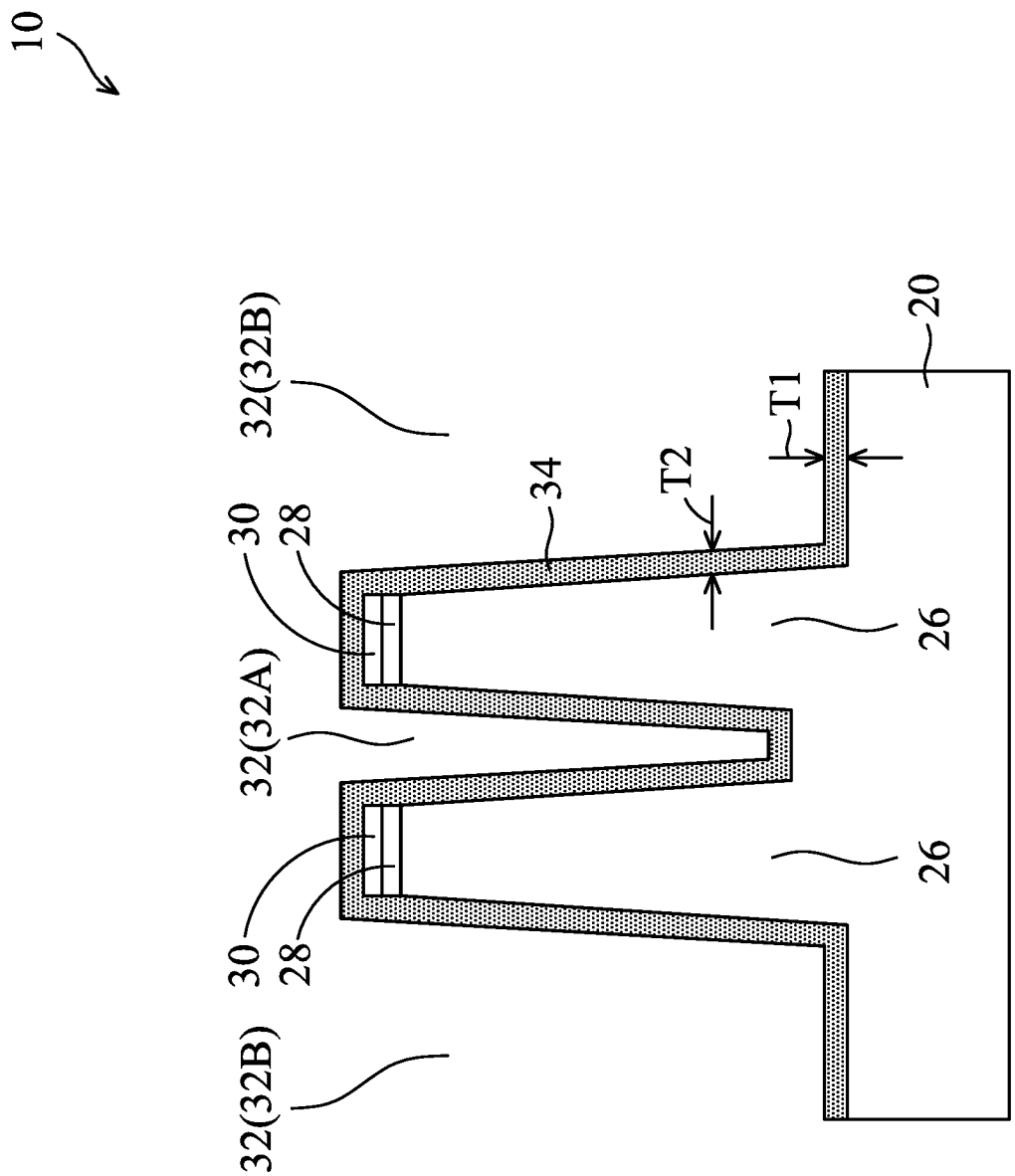

US 11,211,243 B2

METHOD OF FILLING GAPS WITH CARBON AND NITROGEN DOPED FILM

PRIORITY CLAIM AND CROSS-REFERENCE

This application claims the benefit of the following provisionally filed U.S. Patent application: Application Ser. No. 62/770,424, filed Nov. 21, 2018, and entitled "Isolation Region with Good Oxidation Resistance and Method Forming Same;" which application is hereby incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins.

In the formation of the STI regions and the formation of the FinFETs, STI regions are first formed, for example, using flowable oxide, followed by a post treatment using either Ultra-Violet (UV) curing or thermal oxidation in an oxygen-containing environment. The respective wafer is then annealed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2A, 2B, and 3 through 9 are cross-sectional views of intermediate stages in the formation of Shallow Trench Isolation (STI) regions and Fin Field-Effect Transistors (FinFETs) in accordance with some embodiments.

DETAILED DESCRIPTION

Figure 1:
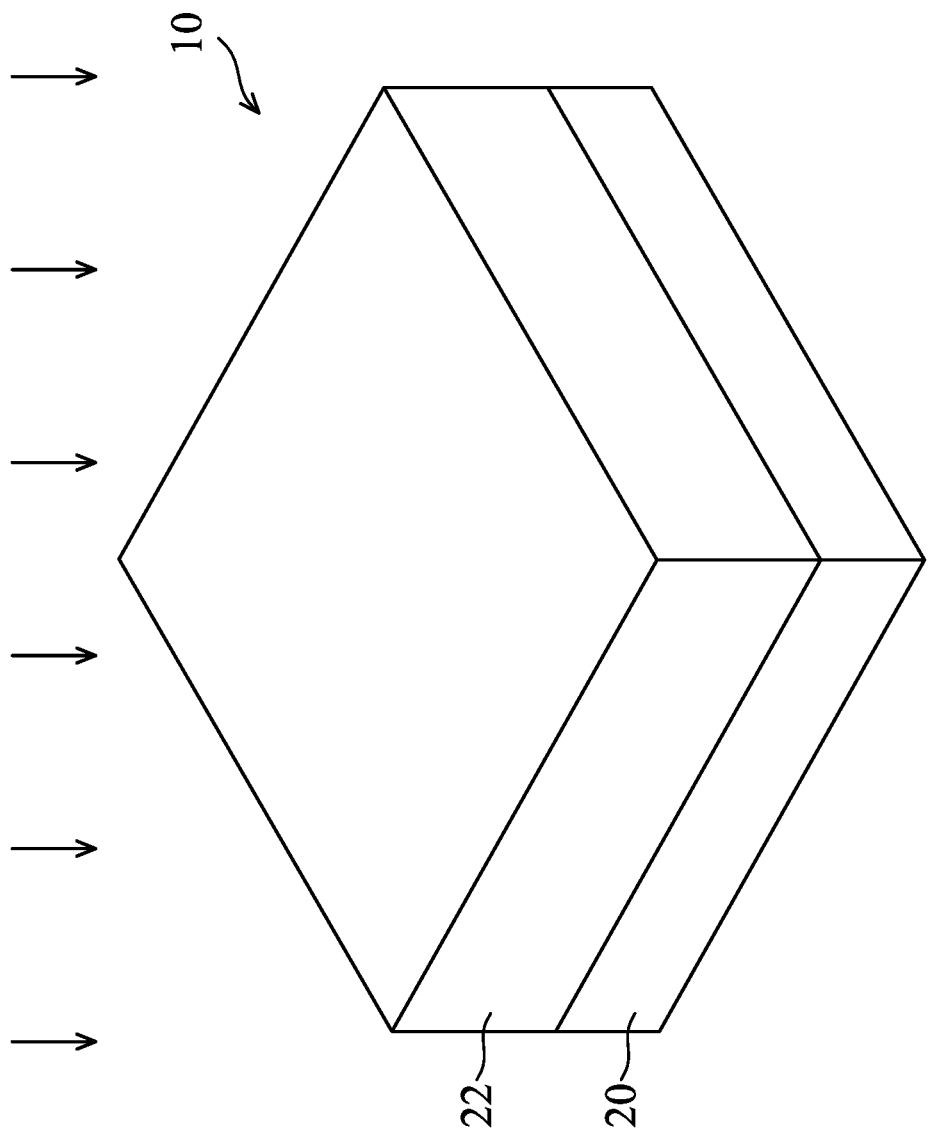

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Shallow Trench Isolation (STI) regions, Fin Field-Effect Transistors (FinFETs), and the methods of forming the same are provided. The intermediate stages in the formation of the STI regions and the FinFETs are illustrated in accordance with some embodiments. Some variations of some embodiments are discussed. Throughout the various views and illustrative embodiments, like reference numbers are used to designate like elements. In accordance with some embodiments of the present disclosure, STI regions are formed by forming SiNOCH films, and then performing anneal processes to convert the Si—N—C bonds in the SiNOCH films to Si—OH bonds, and then to Si—O—Si bonds. Through these processes, the resulting STI regions are free or substantially free from voids and seams.

Embodiments will be described with respect to a specific context, namely a STI formation process by forming a conformal STI layer. The concept of the discussed embodiments may also be applied to the structure and the processing of other structures including, and not limited to, any other gap-filling processes in which silicon oxide is to be filled. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

Figure 22:
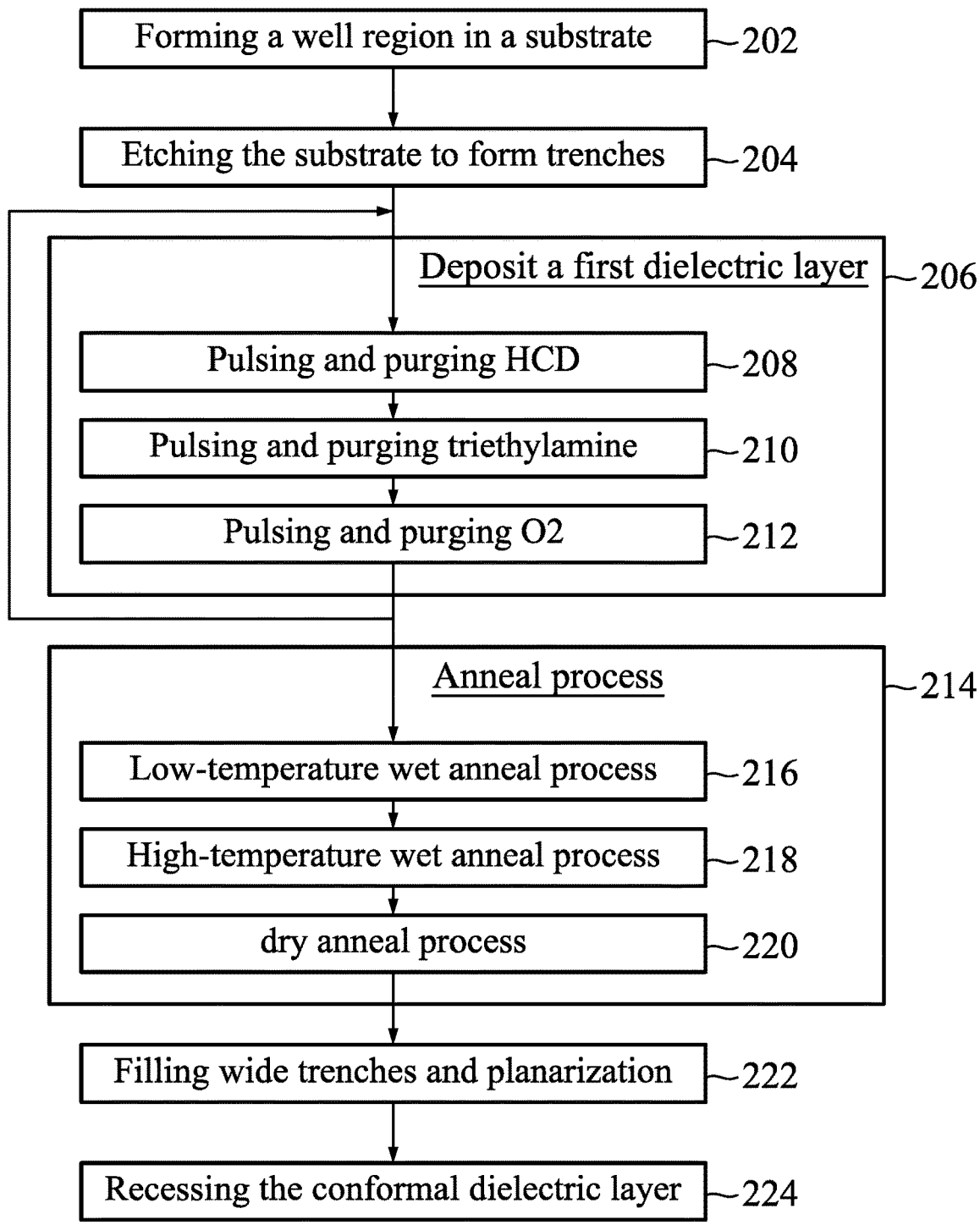
FIG. 22 illustrates a process flow for forming STI regions and a FinFET in accordance with some embodiments.

FIGS. 1, 2A, 2B, and 3 through 9 illustrate the cross-sectional views of intermediate stages in the formation of STI regions and parts of a FinFET in accordance with some embodiments of the present disclosure. The corresponding processes are also reflected schematically in the process flow 200 shown in FIG. 22.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 22. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2A:
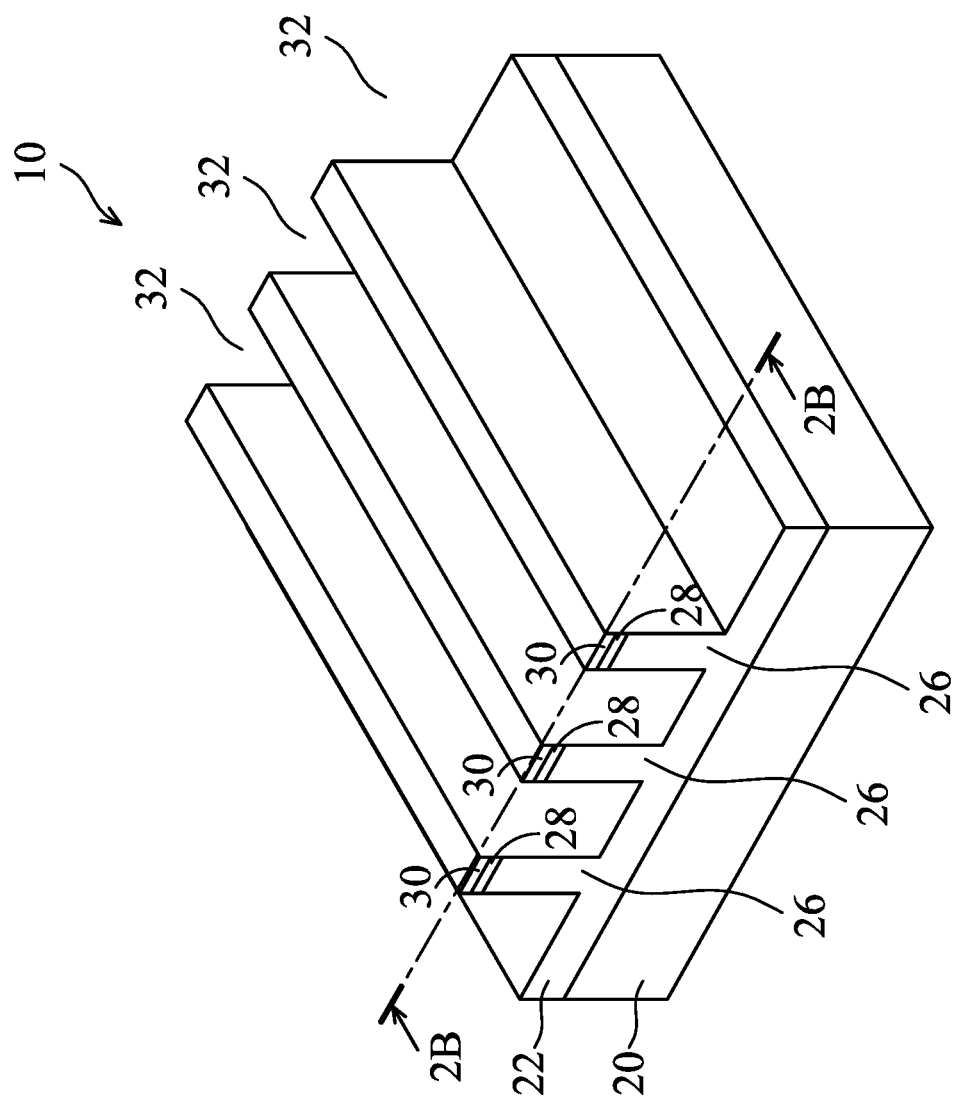

Referring to FIG. 2A, pad oxide layer 28 and hard mask layer 30 are formed on semiconductor substrate 20. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A patterned photo resist (not shown) is formed over hard mask layer 30. Hard mask layer 30 and pad oxide layer 28 are then patterned using the patterned photo resist as an etching mask to form the patterned hard masks 30 as shown in FIG. 2A.

Next, the patterned hard mask layer 30 is used as an etching mask to etch pad oxide layer 28 and substrate 20, resulting in trenches 32 in substrate 20, as also shown in FIG. 2A. The respective process is illustrated as process 204 in the process flow 200 shown in FIG. 22. In accordance with some embodiments of the present disclosure, trenches 32 are formed as trench strips with their lengthwise directions parallel to each other. The portions of semiconductor substrate 20 between trenches 32 are referred to as semiconductor strips 26 hereinafter.

Figure 2B:
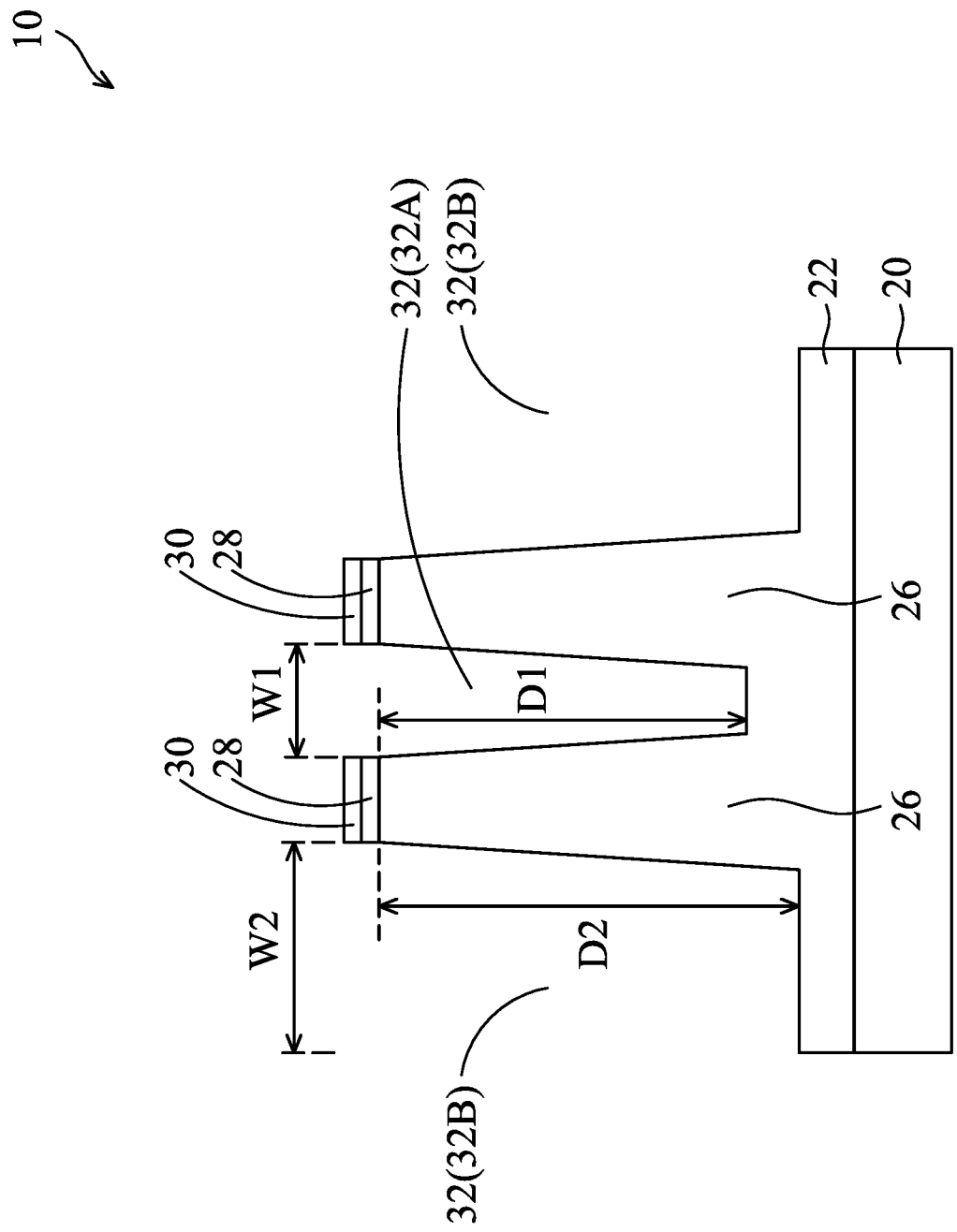

FIG. 2B illustrates a cross-sectional view of the reference cross-section 2B-2B in FIG. 2A. for the simplicity in discussion, two semiconductor strips 26 are illustrated, with the trench therebetween referred to as narrow trench 32A, while there may be a group of closely located semiconductor strips 26 with narrow trenches 32A separating them from each other. In accordance with some embodiments, narrow trenches 32A have small width W1, which may be smaller than about 250 Å, or in the range between about 100 Å and about 250 Å. There may also be wide trenches, for example, on the opposite outer sides of the group of the closely-located semiconductor strips 26. The width W2 of wide trenches 32B is greater than width W1, for example, with ratio W2/W1 being greater than about 2.0. Width W2 may also be greater than about 150 Å. Trenches 32A and 32B are collectively referred to as trenches 32. In accordance with some embodiments of the present disclosure, the depth D1 of narrow trenches 32A is smaller than the depth D2 of wide trenches 32B.

Figure 4:
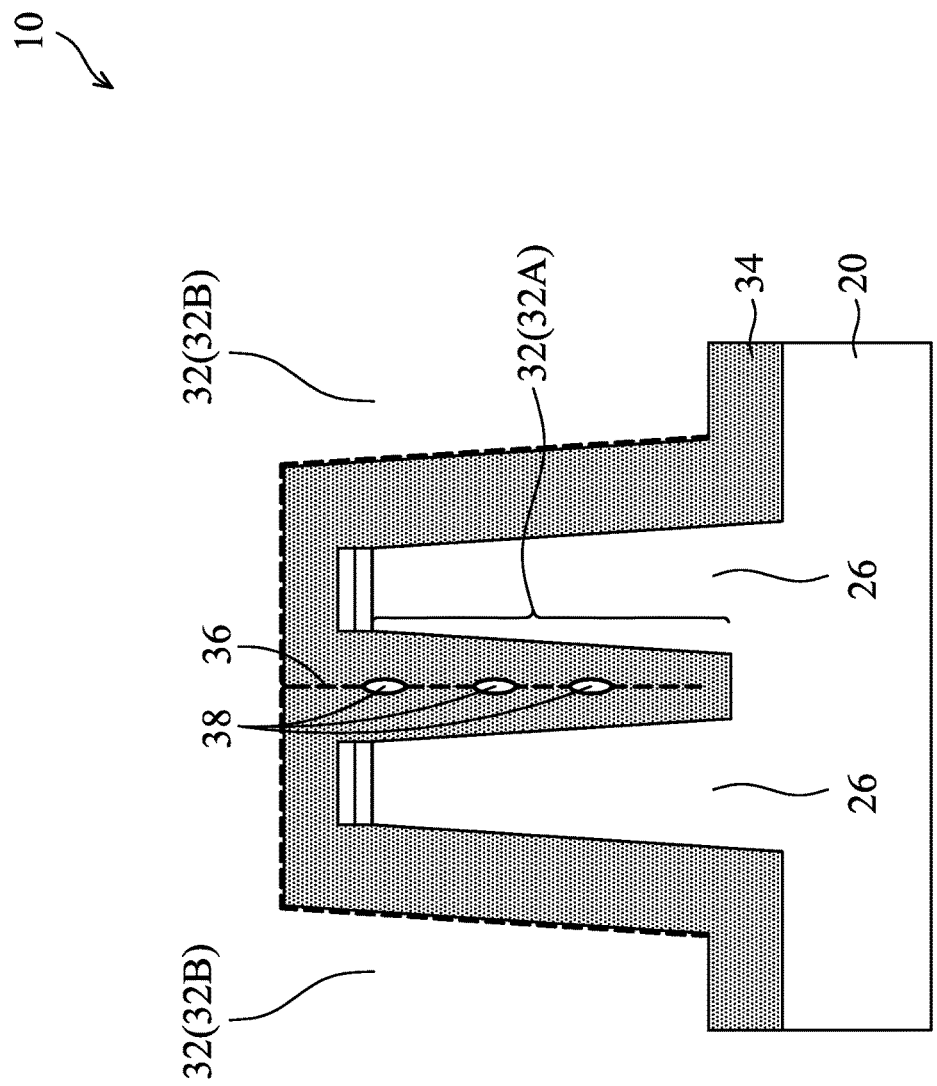

FIGS. 3 and 4 illustrate an intermediate stage in the growth/deposition of dielectric layer 34. The respective process is illustrated as process 206 in the process flow 200 shown in FIG. 22. In the beginning of the deposition process, wafer 10 is placed in an Atomic Layer Deposition (ALD) chamber (not shown), in which ALD cycles are performed to grow dielectric layer 34 conformally. FIG. 3 illustrates the initial growth of dielectric layer 34, which is conformal, and the thickness T1 of the horizontal portions of dielectric layer 34 is equal to the thickness T2 of the vertical portions of dielectric layer 34.

Figure 10:
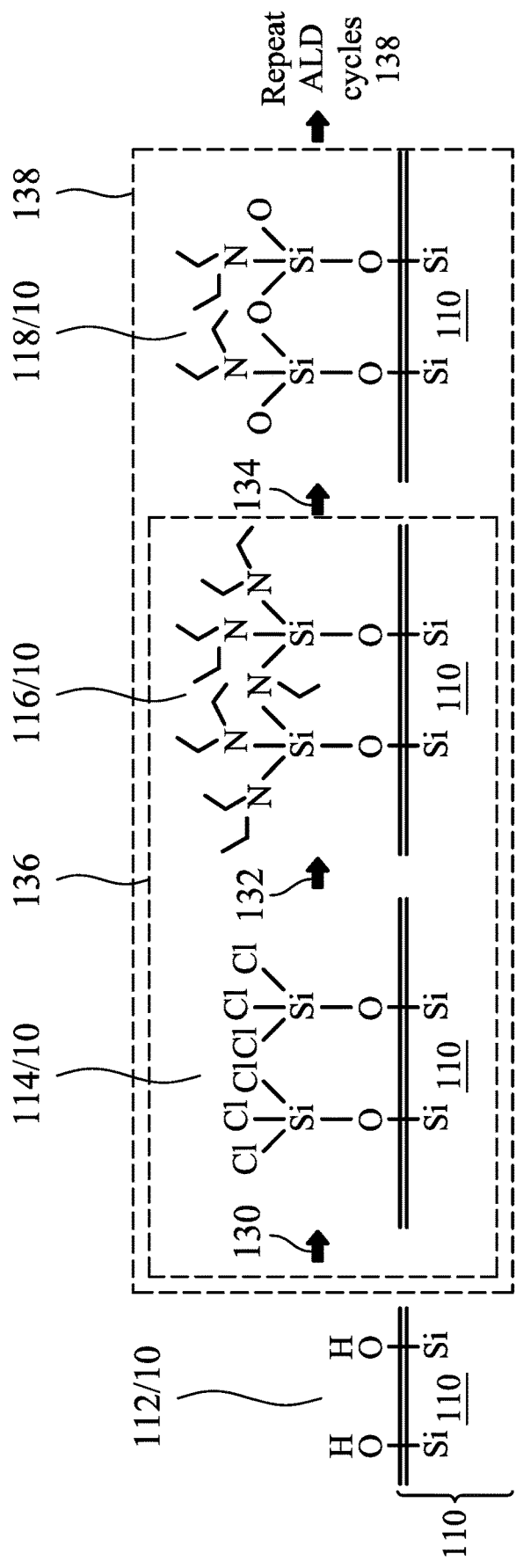
FIG. 10 illustrates an Atomic Layer Deposition (ALD) cycle in the formation of a SiNOCH film in accordance with some embodiments.

FIG. 10 schematically illustrates the intermediate chemical structures of dielectric layer 34 during its growth. The intermediate structures shown in FIG. 10 are identified using reference numerals 112, 114, 116, and 118 to distinguish the structures generated by different stages from each other. Wafer 10 includes base layer 110, which may represent the exposed features including substrate 20, semiconductor strips 26, pad layer 28, and hard masks 30 in FIG. 3, providing they are exposed in the beginning of the deposition process. The initial structure in FIG. 10 is referred to as structure 112. In the illustrated example, base layer 110 is shown as including silicon, which may be in the form of crystalline silicon, amorphous silicon, polysilicon, or the silicon in a compound. In accordance with some embodiments of the present disclosure, due to the formation of native oxide and the exposure to moisture, Si—OH bonds are formed at the surface of silicon-containing layer 110. Base layer 110 may include other types of silicon-containing materials such as silicon oxide, silicon nitride, silicon oxycarbide, silicon oxynitride, or the like. Dielectric layer 34 may also be deposited on other non-silicon-containing layers such as pad layers 28 and hard masks 30, as shown in FIG. 3.

Figure 11B:
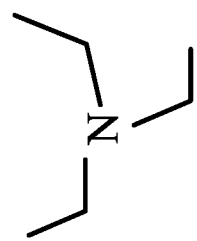
FIGS. 11A and 11B illustrate a chemical structure and a symbol, respectively, of hexachlorodisilane and triethylamine, respectively, in accordance with some embodiments.
Figure 11A:
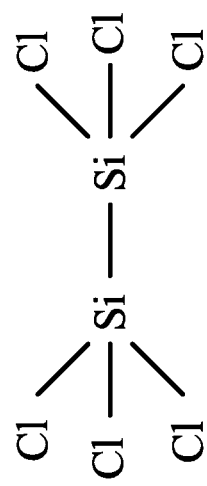

Referring to FIG. 10 again, in process 130, Hexachlorodisilane (HCD) is introduced/pulsed into the ALD chamber, in which wafer 10 (FIG. 3) is placed. The respective process is illustrated as process 208 in the process flow 200 shown in FIG. 22. HCD has the chemical formula of $(SiCl_3)2$. FIG. 11A illustrates a chemical formula of an HCD molecule in accordance with some embodiments. The chemical formula shows that the HCD molecule includes chlorine atoms bonded to two silicon atoms. When HCD is pulsed into the ALD chamber, wafer 10 is heated, for example, to a temperature in the range between about 550° C. and about 670° C. The OH bonds as shown in structure 112 are broken, and silicon atoms along with the chlorine atoms bonded to them are bonded to oxygen atoms to form O—Si—Cl bonds. The resulting structure is referred to as structure 114. In accordance with some embodiments of the present disclosure, no plasma is turned on when HCD is introduced. The HCD gas may be kept in the ALD chamber for a period of time between about 20 seconds and about 25 seconds. The pressure of the ALD chamber may be in the range between about 100 Pa and about 150 Pa in accordance with some embodiments.

Next, HCD is purged from the ALD chamber. The respective process is also illustrated as process 208 in the process flow 200 shown in FIG. 22. In process 132, a process gas including a nitrogen atom bonded with alkyl groups may be pulsed into the ALD chamber. For example, triethylamine may be pulsed. The respective process is illustrated as process 210 in the process flow 200 shown in FIG. 22. Triethylamine may have a chemical formula of $N(CH_2CH_3)_3$, which includes a nitrogen atom bonded to three ethyl groups $(CH_2CH_3)$. FIG. 11B illustrates a chemical formula of triethylamine in accordance with some embodiments. The chemical formula shows that triethylamine includes a nitrogen atom bonded to three ethyl groups, with each of the "<" symbols connected to the N atom representing an ethyl group ($CH_2CH_3$, or a $CH_2$ molecule bonded with a $CH_3$ molecule). With the introduction/pulsing of triethylamine, the temperature of wafer 10 is also kept elevated, for example, in the range between about 550° C. and about 670° C. The temperature may also be kept the same as in the process for introducing HCD. In accordance with some embodiments of the present disclosure, no plasma is turned on when triethylamine is introduced. During the pulsing of triethylamine, the ALD chamber may have a pressure in the range between about 800 Pa and about 1,000 Pa.

Structure 114 reacts with triethylamine. The resulting structure is referred to as structure 116. The Si—Cl bonds in structure 114 are broken, so that nitrogen atoms (for example, in triethylamine) may be bonded to silicon atoms. A silicon atom may be bonded to three nitrogen atoms, with each of the nitrogen atoms further bonded to two ethyl groups. In process 132, the triethylamine may be kept in the ALD chamber for a period of time between about 5 seconds and about 15 seconds, and is then purged from the ALD chamber.

Next, as shown as process 134 in FIG. 10, oxygen ($O_2$) is pulsed into the ALD chamber. The respective process is illustrated as process 212 in the process flow 200 shown in FIG. 22. During process 212, structure 116 reacts with oxygen to generate structure 118. The alkyl groups such as the ethyl groups in structure 116 help to convert the Si—N bonds into Si—O bonds, for example, with the Si—N bonds in structure 116 being broken, and silicon atoms being bonded to oxygen atoms as the result of process 134. Some of the nitrogen atoms along with their bonding ethyl groups may also remain to be bonded to silicon atoms. Some of oxygen atoms may be bonded to two silicon atoms to generate cross-links between some of the silicon atoms. In accordance with some embodiments of the present disclosure, no plasma is turned on when oxygen is introduced. During the pulsing of oxygen, the ALD chamber may have a pressure in the range between about 800 Pa and about 1,000 Pa. Oxygen may be kept in the ALD chamber for a period of time between about 5 seconds and about 15 seconds, and is then purged from the ALD chamber.

In above-discussed processes, the processes 130 and 132 in combination may be referred to as an ALD cycle 136, with ALD cycle 136 resulting in the growth of an atomic layer comprising silicon atoms, and the corresponding bonded nitrogen atoms and ethyl groups. Also, the processes 130, 132, and 134 in combination may also be referred to as an ALD cycle 138, with ALD cycle 138 resulting in the growth of an atomic layer comprising silicon atoms and the corresponding bonded nitrogen atoms and ethyl groups, and the bonding oxygen atoms. In accordance with some embodiments, an atomic layer resulted from an ALD cycle 138 has a thickness of about 1 Å.

Figure 12:
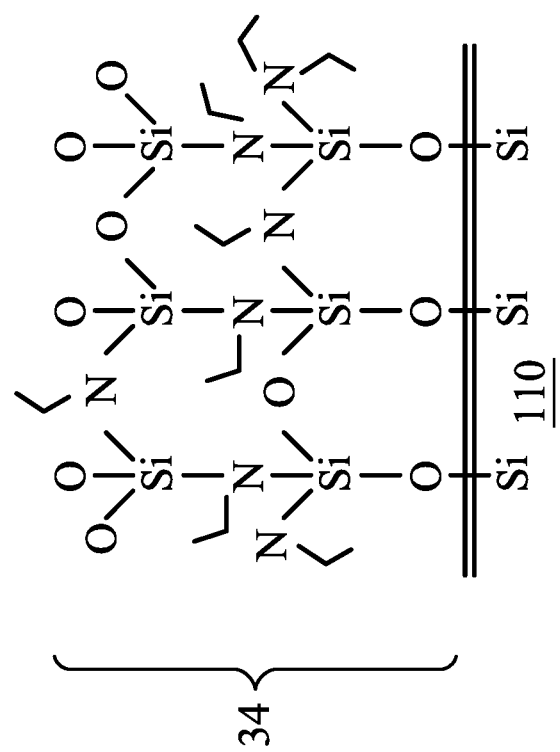
FIG. 12 illustrates a schematic chemical structure of a SiNOCH film in accordance with some embodiments.

After the process 134 is finished, the ALD cycle 138 including processes 130, 132, and 134 are repeated, so that a plurality of atomic layers are deposited to form dielectric layer 34, as shown in FIG. 4. In a subsequent ALD cycles, the Si—O bonds and the Si—N bonds formed in a previous ALD cycle may be broken, and Si—Cl bonds may be formed due to the pulsing of HCD. The Si—Cl bonds may then be replaced with the Si—N bonds and the corresponding ethyl groups. $O_2$ may then be used to form Si—O bonds, which replace some Si—N bonds. FIG. 12 illustrates an additional atomic layer as an example. It is appreciated that depending on the desirable thickness of dielectric layer 34, there may be many atomic layers. Dielectric layer 34, as deposited, is a SiNOCH layer.

Figure 13:
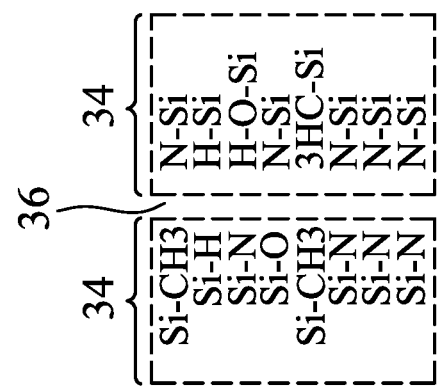
FIG. 13 schematically illustrates a seam separating two portions of a SiNOCH film in accordance with some embodiments.

The ALD cycle 138 is repeated until the resulting dielectric layer 34 has a desirable thickness. For example, as shown in FIG. 4, the portions of dielectric layer 34 grown from neighboring semiconductor strips 26 are grown toward each other, and are eventually in contact with each other to generate interface 36. It is appreciated that there may be a seam generated, which is also referred to as 36. There may also be some voids 38 generated at the interface 36, which voids may be due to the small recesses on the sidewalls of semiconductor strips 26. It is appreciated that although the portions of dielectric layer 34 grown from neighboring semiconductor strips 26 are in contact with each other, they are merely in contact with each other, with no cross-link formed therebetween. For example, FIG. 13 schematically illustrates the seam/interface 36 formed between the left-side portion of dielectric layer 34 and the right-side portion of dielectric layer 34, with no cross-link formed between the boundary atoms of the left-side portion and the right-side portion.

In accordance with some embodiments of the present disclosure, after the ALD cycles 138, the resulting dielectric layer 34 has a carbon percentage in the range between about 1 percent and about 15 percent, and a nitrogen percentage in the range between about 5 percent and about 20 percent. The majority of the rest elements in dielectric layer 34 are silicon and oxygen, which may have an atomic ratio of silicon to oxygen being about 1.5:2 to about 1:2.5. The ratio which may be for example, around about 1:2.

After the deposition (the growth) of dielectric layer 34, an anneal process is performed. The respective process is illustrated as process 214 in the process flow 200 shown in FIG. 22. In accordance with some embodiments of the present disclosure, the anneal process includes a low-temperature wet anneal process (process 216), a high-temperature wet anneal process (process 218), and a dry anneal process (process 220). The low-temperature process and high-temperature wet anneal process may be performed using steam ($H_2O$) as the process gas. The dry anneal process may be performed using nitrogen ($N_2$), argon, or the like as carrier gases. The anneal processes are discussed below referring to FIGS. 14 through 20.

Figure 15:
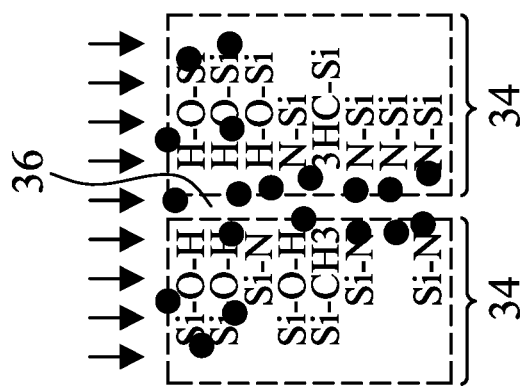

In accordance with some embodiments of the present disclosure, the low-temperature wet anneal process is first performed. The respective process is illustrated as process 216 in the process flow 200 shown in FIG. 22. The low-temperature wet anneal process is performed at a relatively low temperature in the range between about 300° C. and about 450° C. The low-temperature wet anneal process may last for a period of time in the range between about 3 hours and about 5 hours. The pressure during the low-temperature anneal may be about 1 atmosphere. The low-temperature wet anneal process has two functions. The first function is to make the water/steam ($H_2O$) molecules penetrate into dielectric layer 34, as schematically illustrated in FIG. 15, wherein the solid dots represent the $H_2O$ molecules. The second function is to partially convert the Si—N—C bonds, Si—$CH_3$ bonds, and Si—N—Si bonds in dielectric layer 34 into Si—OH bonds. The temperature is controlled to be high enough to incur at least partial conversion.

Figure 14:
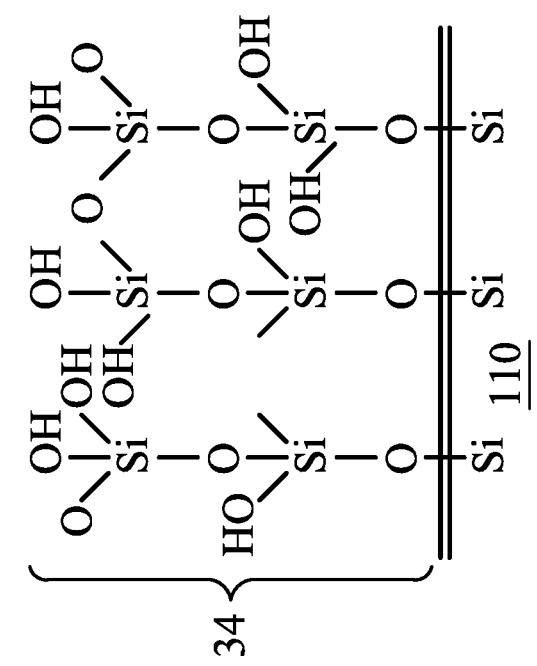
FIG. 14 illustrates a schematic chemical structure after a wet anneal process is performed on a SiNOCH film in accordance with some embodiments.
Figure 21:
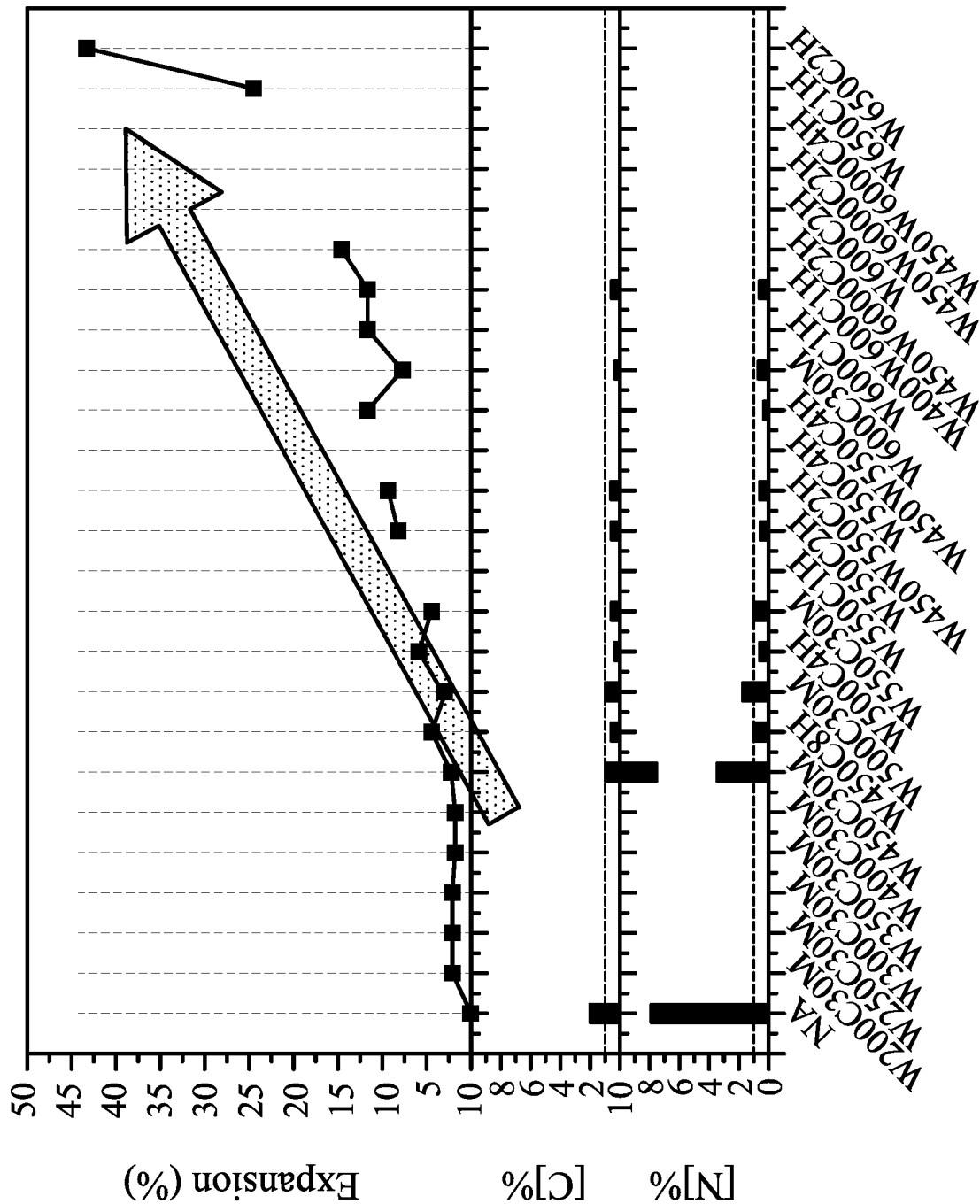
FIG. 21 illustrates the effect of wet anneal conditions on nitrogen concentrations, carbon concentrations, and expansion rates in a deposited dielectric film in accordance with some embodiments.

FIG. 21 illustrates some experiment results, wherein the X-axis represents the anneal conditions including annealing temperature and annealing time. The letter "C" of each X-axis value represents the annealing temperature in degrees centigrade, and the letter "M" represents the annealing time in minutes, while the letter "H" represents the annealing time in hours. For example, "W200C30M" represents the corresponding values are obtained when the wafer is annealed at 200° C. for 30 minutes. There are three Y-axes, representing nitrogen ([N]) atomic percentage, carbon ([C]) atomic percentage, and expansion rate of the annealed dielectric layer. The results in FIG. 21 indicate that before the anneal process (corresponding to the X-axis value "NA"), the carbon percentage and the nitrogen percentages are high. With the lasting of the anneal process and/or the adoption of higher temperatures, the carbon percentage and the nitrogen percentages are reduced to certain levels such as less than 1 percent. This means that the original carbon and nitrogen atoms (as in FIG. 12) start to be converted into OH, which is shown in FIG. 14. Also, as shown in FIG. 21, when the temperature is higher than 450° C., the expansion rate of the dielectric film may increase. Since the surface portion of dielectric layer 34 expands earlier than the inner portion, the expansion of the surface portion of dielectric layer may adversely prevent $H_2O$ molecules from penetrating into, and reaching, the inner portion of the dielectric layer. Accordingly, to avoid the surface portion of dielectric layer 34 from expanding pre-maturely, the low-temperature wet anneal process is performed at a temperature (lower than about 450° C., for example) at which the dielectric layer 34 does not expand. On the other hand, to improve the conversion efficiency and the steam penetration efficiency, the low-temperature wet anneal process is performed at a temperature that is not too low, and the temperature may be in the range between about 300° C. and about 450° C.

Figure 19:
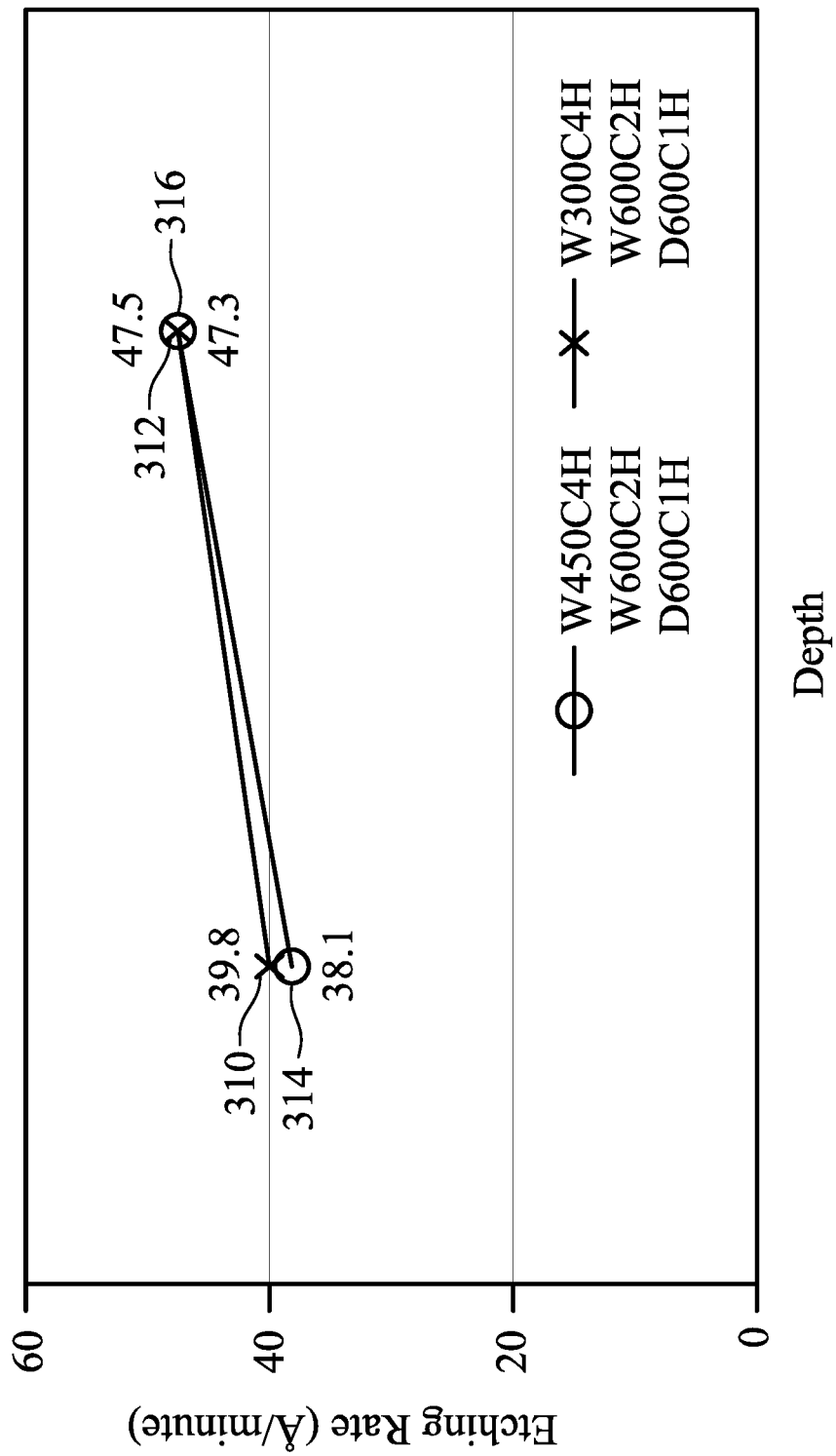
FIG. 19 illustrates the effect of converting Si—C—N bonds to Si—OH bonds through a low-temperature wet anneal process in accordance with some embodiments.
Figure 20:
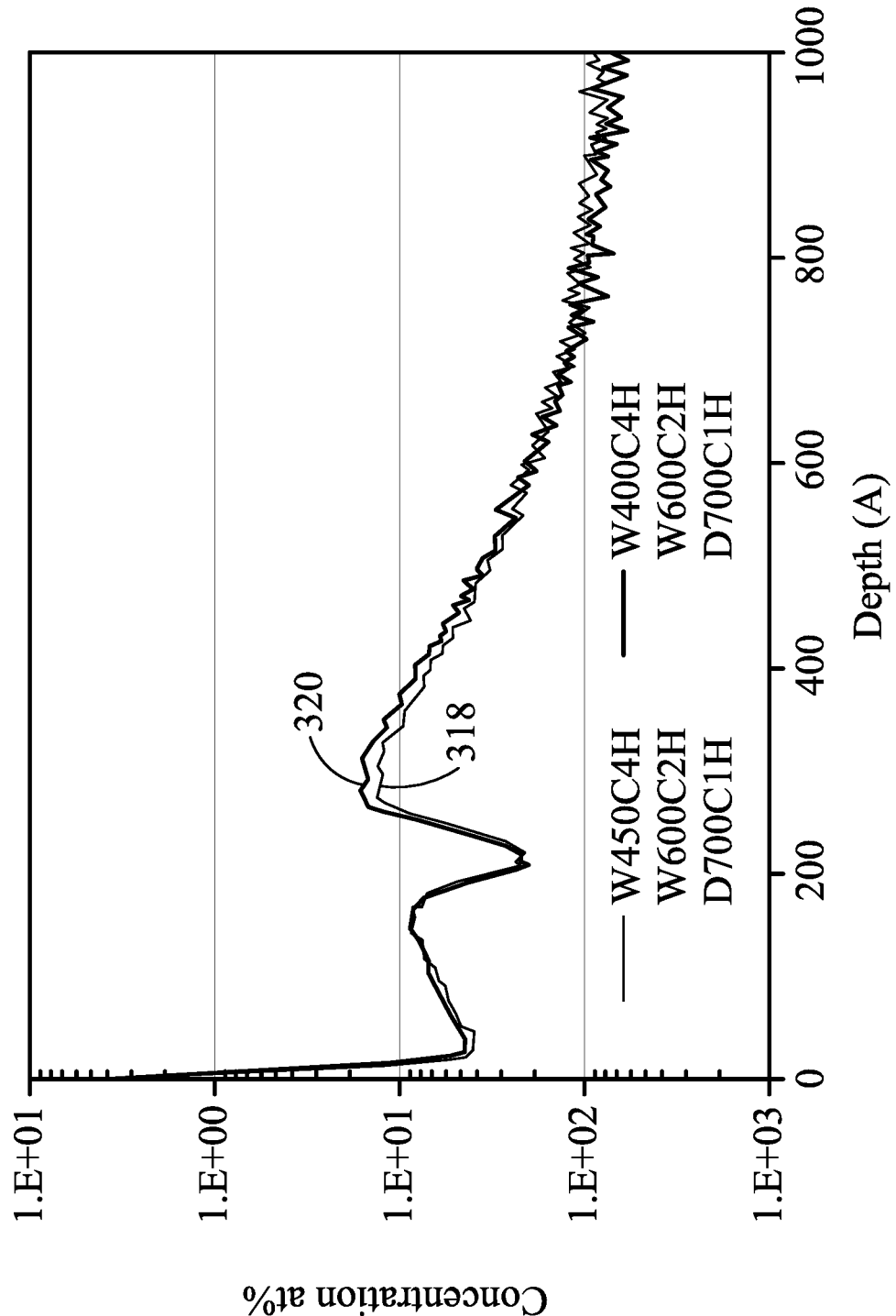
FIG. 20 illustrates the carbon concentration as a function of depths when different low-temperatures are used for the wet anneal processes in accordance with some embodiments.

FIGS. 19 and 20 illustrate the results measured from samples, and reveal that the low-temperature wet anneal process at 300° C. and 450° C. have similar results. FIG. 19 illustrates the etching rate (of dielectric layer 34) as a function of the depth into dielectric layer 34. The etching rate is an indication of the composition of dielectric layer 34, such as how many C and N atoms are replaced with OH groups. Values 310 and 312 are the results of annealing at 300° C. for 4 hours. Values 314 and 316 are the results of annealing at 450° C. for 4 hours. The samples are also annealed at the same higher annealing temperature conditions (600° C. for 2 hours) and the same dry annealing temperature conditions (600° C. for 1 hour). FIG. 19 reveals that the although the low-temperature wet anneal processes are performed at different temperatures, their etching rate at different depths of the samples are similar, indicating that the low-temperature wet anneal temperature of 300° C. and 450° C. do not cause difference to the penetration of $H_2O$ molecules.

FIG. 20 illustrates the carbon concentration as a function of the depth into dielectric layer 34. Again, line 318 is the result of low-temperature wet anneal at 300° C. for 4 hours. Line 320 is the results of low-temperature wet anneal at 450° C. for 4 hours. The samples corresponding to lines 318 and 320 are also annealed at the same higher annealing temperature conditions (600° C. for 2 hours) and the same dry annealing temperature conditions (600° C. for 1 hour). FIG. 20 reveals that although the low-temperature wet anneal processes are performed at different temperatures, the carbon percentage, which is the indication of the conversion rate (from C—N to OH) at different depths of the samples, are similar. These results reveal that adopting 300° C. or 450° C. as the temperature of the low-temperature anneal process does not cause difference to the penetration of $H_2O$ molecules.

Figure 16:
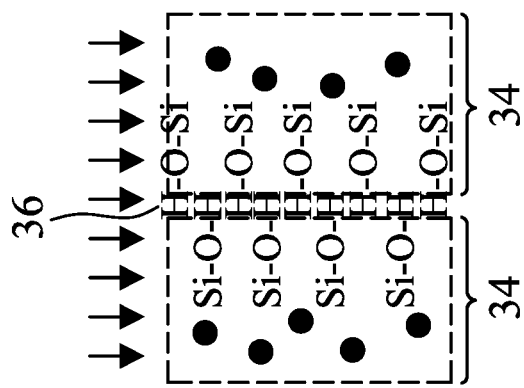
FIGS. 15 and 16 schematically illustrate the bonds at a seam after a low-temperature wet anneal process and a high-temperature wet anneal process, respectively, in accordance with some embodiments.

After the low-temperature wet anneal process, a high-temperature wet anneal process is performed. The respective process is illustrated as process 218 in the process flow 200 shown in FIG. 22. The high-temperature wet anneal process is performed at a relatively high temperature in the range between about 450° C. and about 650° C. The high-temperature wet anneal process may last for a period of time in the range between about 1.5 hours and about 2.5 hours. The pressure of the high-temperature anneal process may be about 1 atmosphere. The temperature is high enough to efficiently convert the Si—C—N bonds in dielectric layer 34 into Si—OH bonds, as schematically illustrated in FIG. 16. On the other hand, the temperature cannot be too high to cause the excess oxidation of the semiconductor materials. For example, when semiconductor strips 26 comprises SiGe, the temperature of the high-temperature anneal process should be lower than about 650° C. Otherwise, SiGe may be oxidized. Silicon may also be oxidized at temperatures higher than about 650° C., although at a lower rate. Accordingly, the temperature of the high-temperature wet anneal process may be in the range between about 500° C. and about 650° C., or between about 500° C. and about 600° C.

The high-temperature wet anneal process results in the Si—N bonds and Si—O bonds to be broken. The alkyl groups attached to the N atoms are also broken off along with the nitrogen atoms. OH groups are attached to the broken bonds. The resulting chemical structure may be schematically illustrated in FIG. 14. FIG. 16 illustrates the structure at the interface 36 (also refer to FIG. 4). Si—OH bonds formed in the portions of dielectric layer 34 on opposite sides of interface 36 are closely located, and the portions of dielectric layer 34 on opposite sides of interface 36 may contact with each other. However, no cross-link is formed. During the high-temperature wet anneal process, dielectric layer 34 expands, and the expansion rate in the volume may be up to about 10 percent. As a result of the expansion, the portions of dielectric layer 34 on opposite sides of interface 36 are in tight contact with each other, and seam 36 (FIGS. 4 and 15) and voids 38 (FIG. 4) may be eliminated. This enables the subsequent cross-linking process to be possible.

After the high-temperature wet anneal process, a dry anneal process is performed for cross-linking. The respective process is illustrated as process 220 in the process flow 200 shown in FIG. 22. An oxygen-free process gas such as nitrogen ($N_2$), argon, or the like may be used as the process gases. The dry anneal temperature cannot be too high or too low. If the temperature is too low, the OH bonds may not be broken, and the cross-linking may not be achieved. If the temperature is too high, the semiconductor (such as SiGe) may intermix with the surrounding materials. In accordance with some embodiments of the present disclosure, the dry anneal process is performed at a temperature in the range between about 550° C. and about 650° C. The dry anneal process may last for a period of time in the range between about 0.5 hours and about 1.5 hours. The pressure may be around 1 atmosphere. A carrier gas may be used to carry away the generated $H_2O$ steam. The carrier gas may be nitrogen, argon, or the like.

Figure 18:
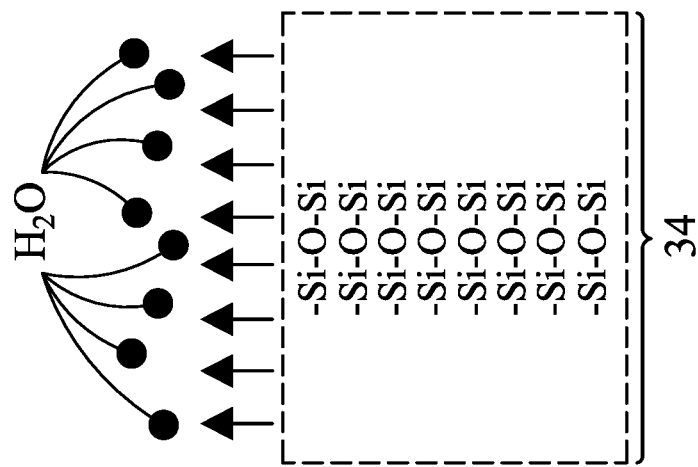
FIG. 18 schematically illustrates the cross-link at a seam in accordance with some embodiments.
Figure 17:
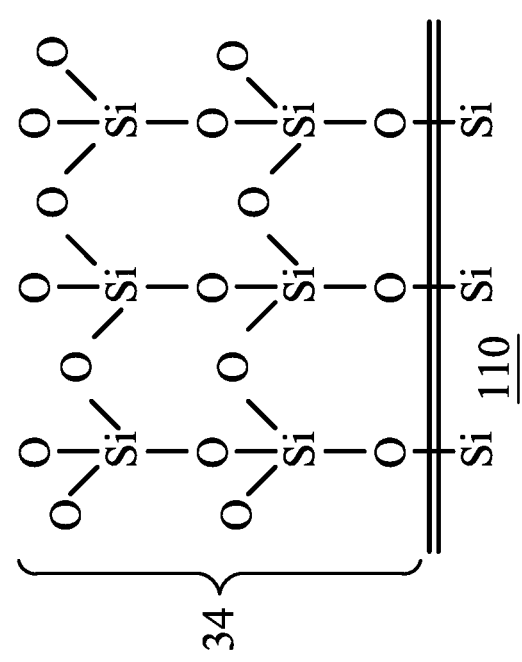
FIG. 17 illustrates a schematic chemical structure of silicon oxide after a dry anneal process in accordance with some embodiments.

In the dry anneal process, the OH bonds and the Si—O bonds (FIGS. 14 and 16) are broken, and the broken H and OH combine to form $H_2O$ molecules, as shown in FIG. 18. The oxygen atoms, whose bonds become dangling due to the loss of H atoms, may bond with Si to form silicon oxide ($SiO_2$). After the dry anneal process is finished, there may be small percentages of carbon and nitrogen atoms left in the silicon oxide (dielectric layer 34), with the atomic percentages of carbon and nitrogen being smaller than about 1 percent, and possibly between about 0.5 percent and about 1.0 percent. This is different from the STI regions formed using conventional methods, in which carbon may not exist.

Figure 5:
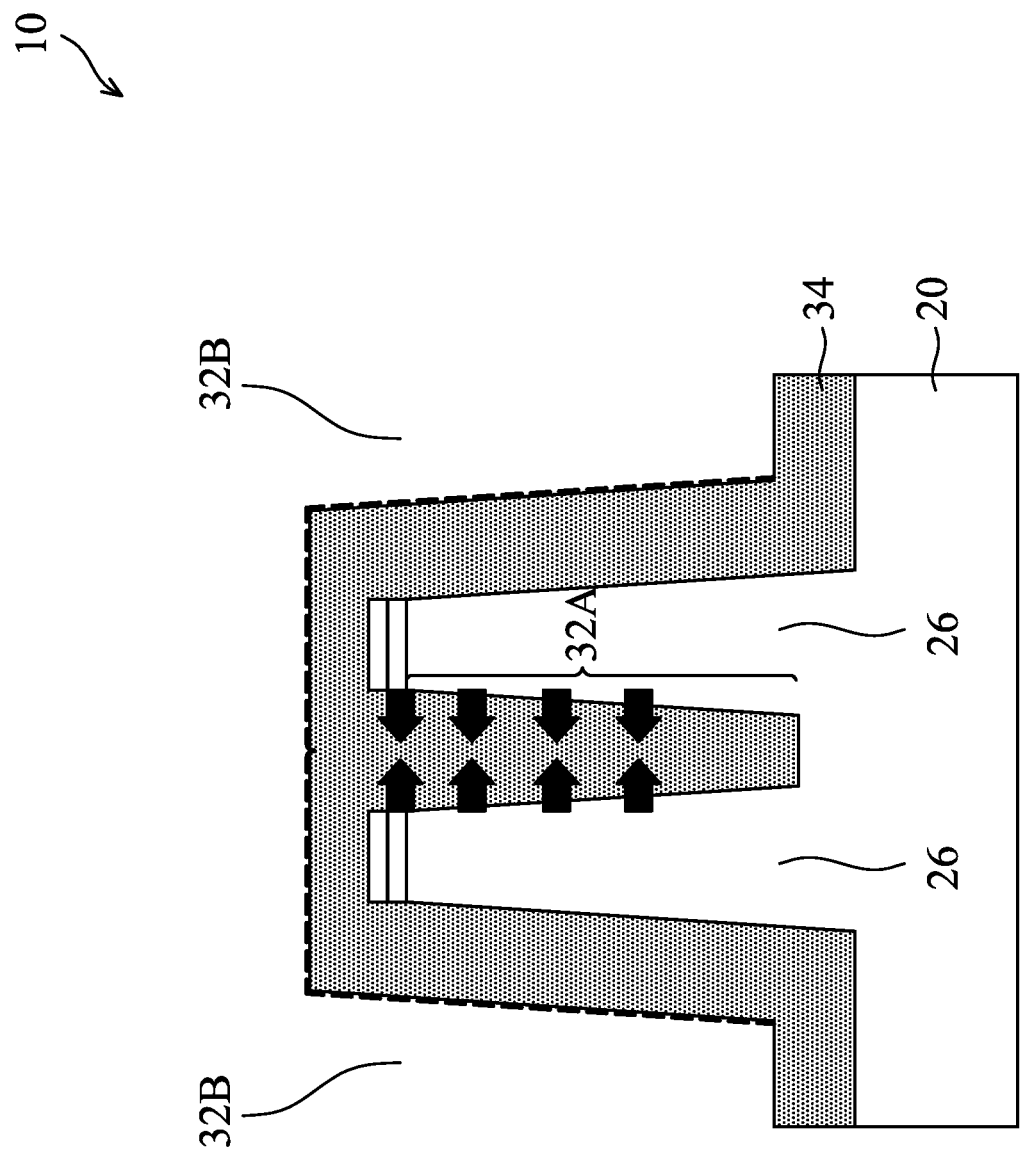

As shown in FIG. 18, the silicon atoms on opposite sides of the previously existed interface/seam 36 are cross-linked by oxygen atoms. Cross-links are thus formed between the portions of dielectric layer 34 on opposite sides of interface 36. $H_2O$ molecules, which are represented by the solid dots, are carried away. FIG. 5 illustrates the resulting structure, in which the seam/interface formed in the deposition process has been eliminated, and there may not be distinguishable interface any more.

In accordance with some embodiments, narrow trenches 32A are fully filled in the preceding processes. Since the deposition of dielectric layer 34 is performed using ALD, which is a conformal deposition method, the wide trenches 32B may not be fully filled when the deposition process is finished. Accordingly, as shown in FIG. 5, some portions of wide trenches 32B are left unfilled. The portions of dielectric layer 34 in wide trenches 32B are conformal.

Figure 6:
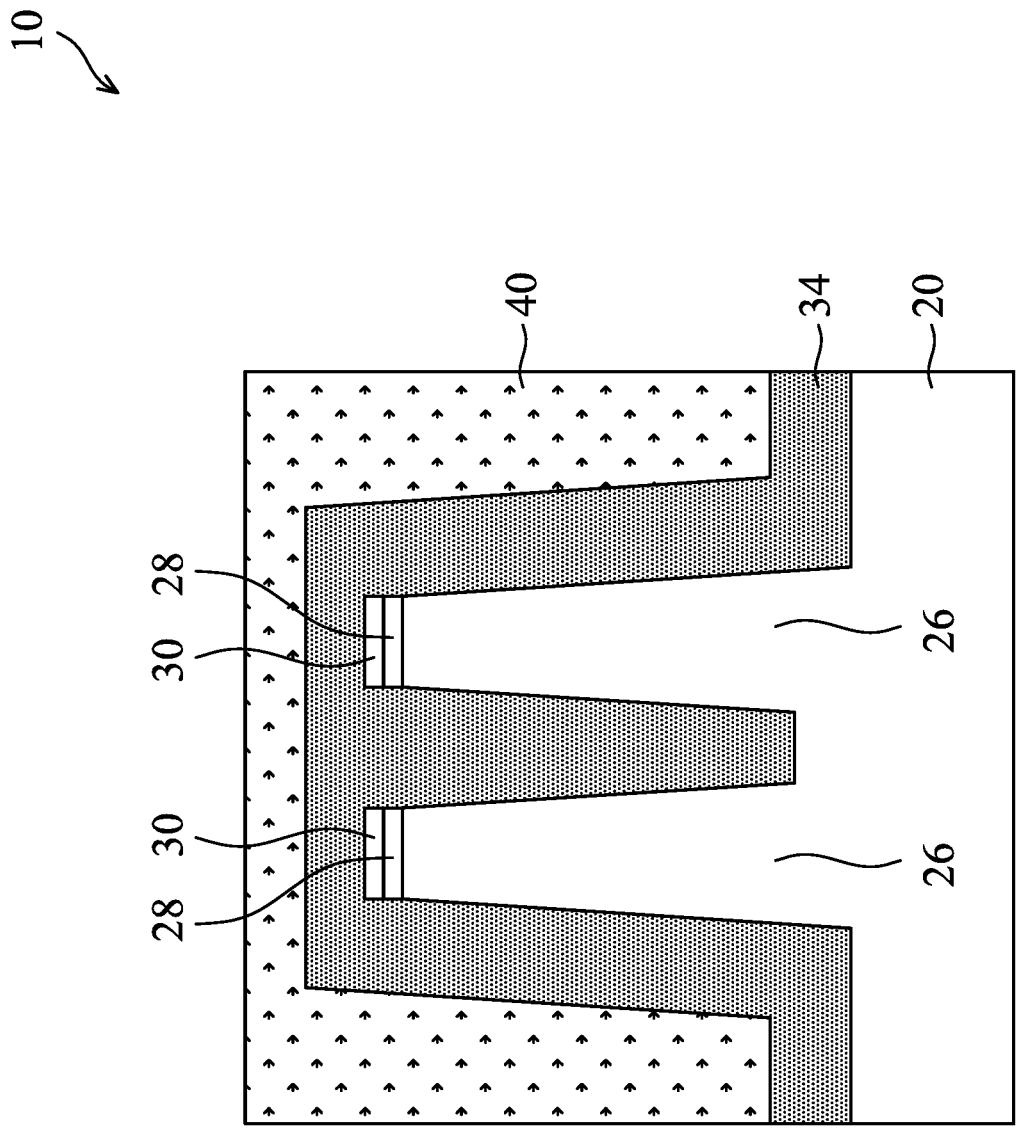

Referring to FIG. 6, the remaining wide trenches 32B are filled with dielectric layer 40. The respective process is illustrated as process 222 in the process flow 200 shown in FIG. 22. Dielectric layer 40 may also be a deposited silicon nitride layer, carbon-containing dielectric, or the like formed using, for example, ALD, High-Density Plasma Chemical Vapor Deposition (HDPCVD), or Chemical Vapor Deposition (CVD). Dielectric layer 40 may also be formed of SiOCN using Flowable Chemical Vapor Deposition (FCVD), spin-on coating, or the like. Dielectric layer 40 is deposited to a level higher than the top surface of dielectric layer 34.

Figure 7:
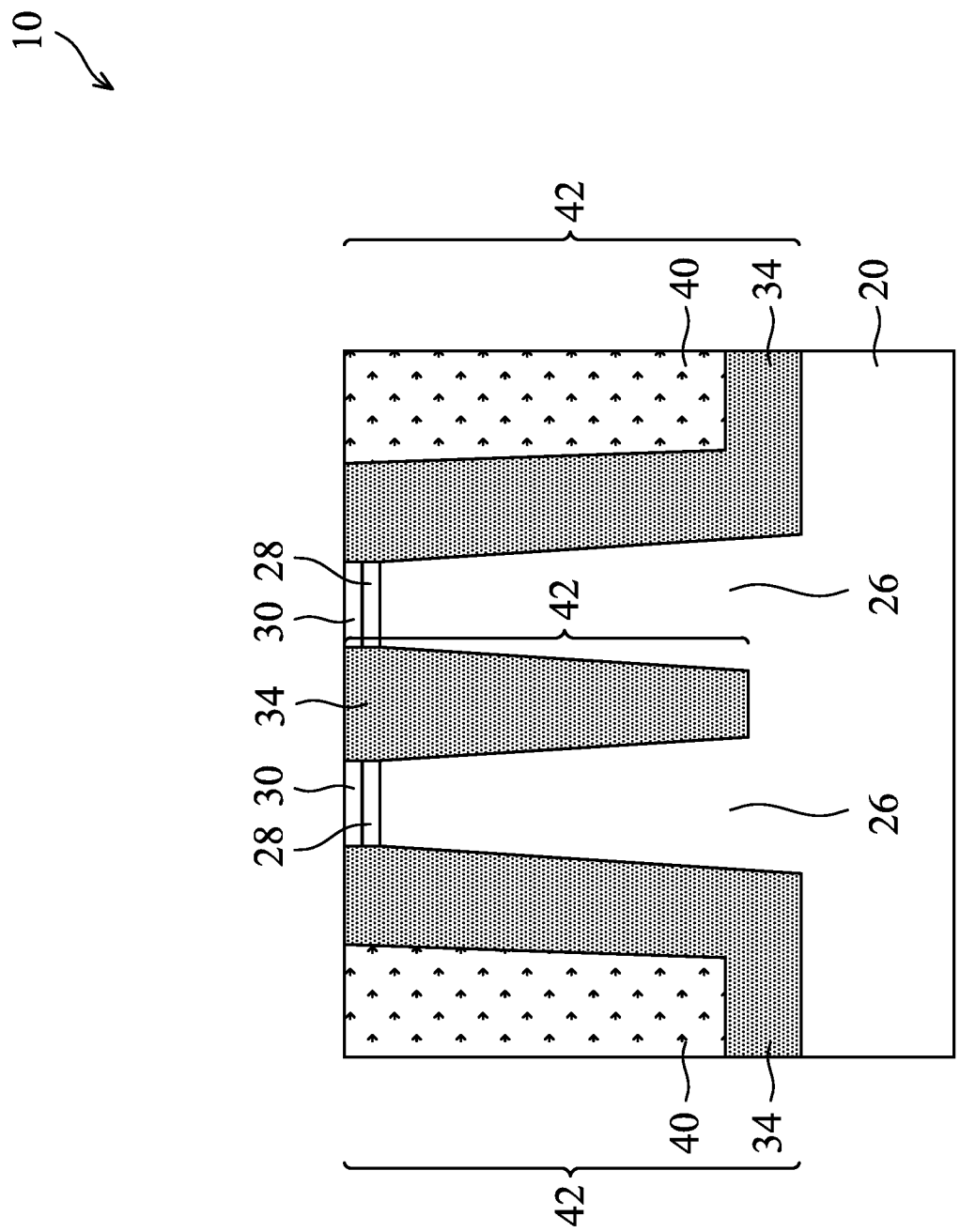

Referring to FIG. 7, a planarization process such as a Chemical Mechanical Polish (CMP) process or a mechanical grinding process is then performed to remove excessing portions of the dielectric materials. The remaining portions of the dielectric materials(s) are STI regions 42. The respective process is also illustrated as process 222 in the process flow 200 shown in FIG. 22. The planarization process may be performed using hard masks 30 as a CMP stop layer. The STI regions 42 between closely located semiconductor strips 26 may be formed of a homogeneous material 34, which extends all the way to opposite semiconductor strips 26. The STI regions formed in the wide trenches may include conformal dielectric layer 34 and dielectric region 40. Dielectric layer 34 will have vertical portions on opposite sides of, and contacting opposite sidewalls of, dielectric region 42, although one vertical portion is shown.

Figure 8:
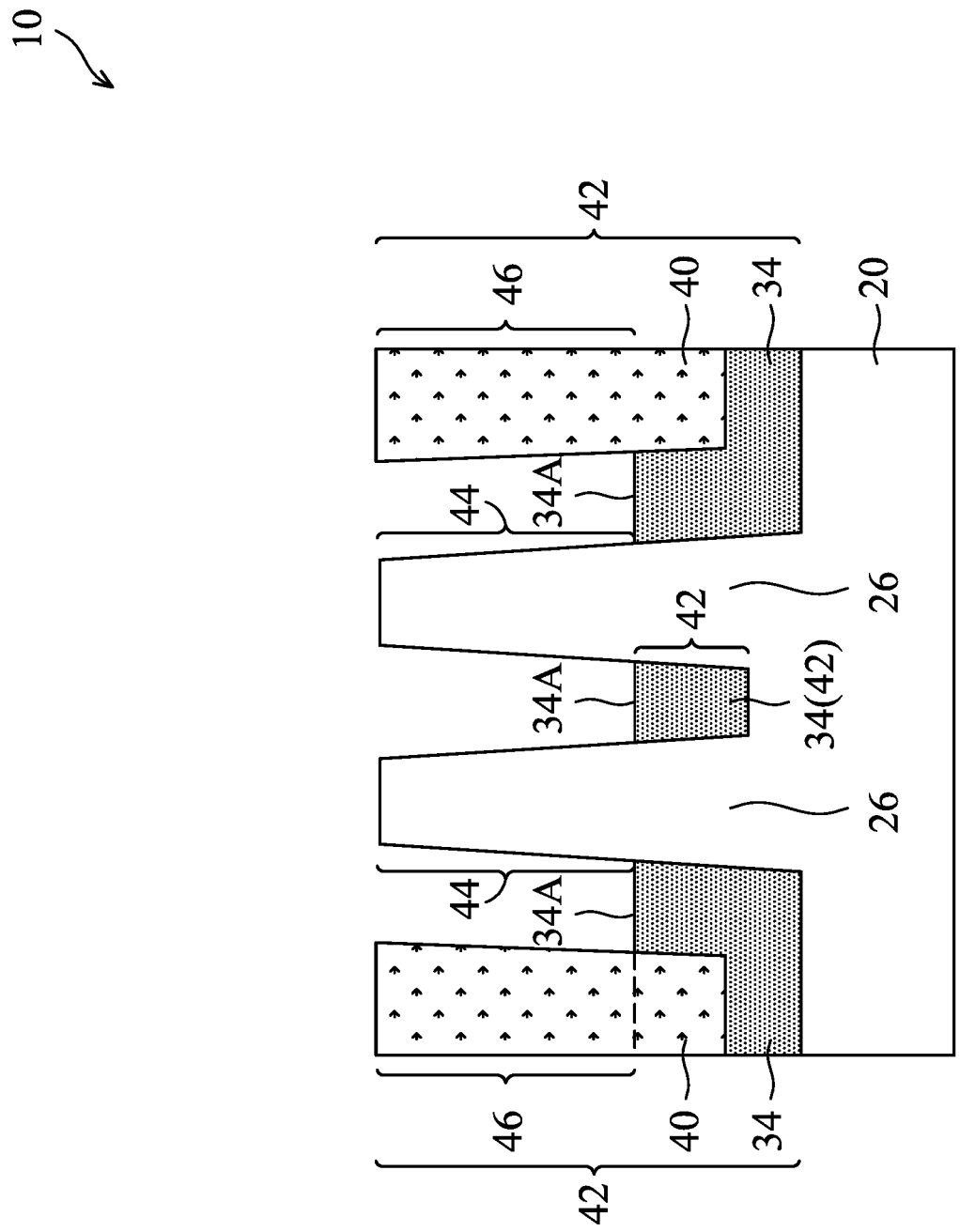

Hard mask 30 and pad oxide layer 28 are then etched. As shown in FIG. 8, dielectric layer 34 is recessed, so that the top portions of semiconductor strips 26 protrude higher than the top surfaces 34A of the remaining portions of STI regions 42 to form protruding fins 44. The respective process is illustrated as process 224 in the process flow 200 shown in FIG. 22. The etching may be performed using a dry etching process, for example, using $HF_3$ and $NH_3$ as the etching gases. In accordance with alternative embodiments of the present disclosure, the recessing of dielectric layer 34 is performed using a wet etch process. The etching chemical may include HF solution, for example.

In the recessing process, dielectric region 40 are not etched, resulting in dummy (dielectric) fins 46 to protrude higher than the top surfaces 34A of the remaining portions of STI regions 42. Dummy dielectric fins 46 are such named since features 46 protrude above the neighboring dielectric layer 34, hence forming fins, while these fins, unlike typical semiconductor fins that can be used for forming FinFETs, cannot be used to form FinFETs. Due to the conformal deposition of dielectric layer 34, the wide trenches 32B (FIG. 2B) are not fully filled when the narrow trenches 32A are filled by dielectric layer 34. This makes the filling of dielectric layer 40 possible, and makes the formation of dummy fins 46 possible. The generation of the dummy fins helps to improve the device performance of the FinFETs when the dimensions of FinFETs are very small.

Figure 9:
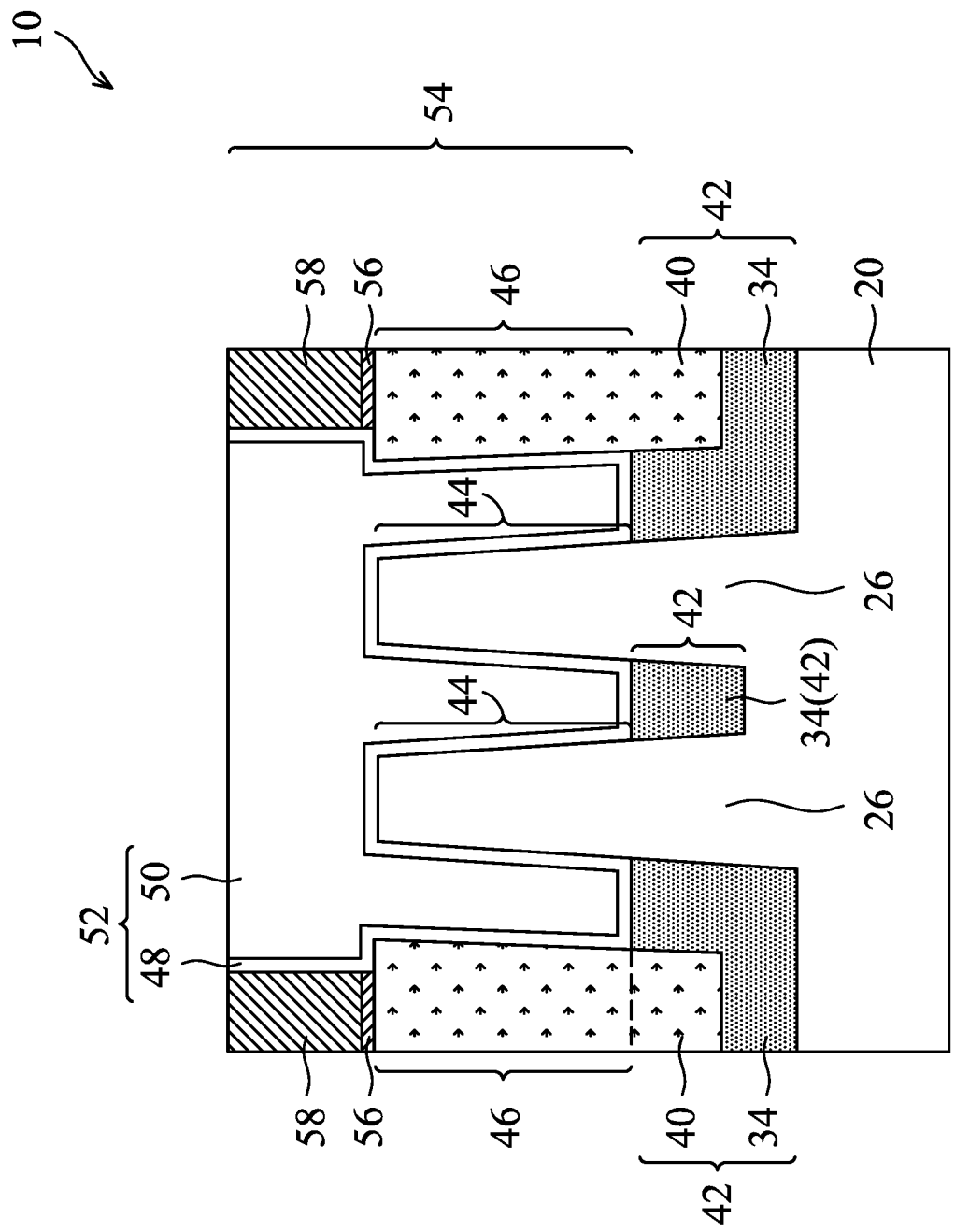

In subsequent formation processes, A FinFET 54 (FIG. 9) is formed based on protruding semiconductor fins 44. FIG. 9 illustrates a cross-sectional view of protruding fins 44 and gate stack 52, which extend on the sidewalls and top surfaces of protruding semiconductor fins 44 and dummy fins 46. An example formation process is discussed briefly in subsequent paragraphs.

In accordance with some embodiments of the present disclosure, a dummy gate stack (not shown) is formed extending on the sidewalls and top surfaces of protruding semiconductor fins 44 and dummy fins 46. A gate spacer (not shown) is then formed on the sidewalls of the dummy gate stack. Source/drain regions (not shown) are then formed on the opposite sides of the dummy gate stack and the gate spacer, for example, by etching the portions of protruding semiconductor fins 44 not covered by the dummy gate stack, and epitaxially growing the source/drain regions. Contact Etch Stop Layer (CESL) 56 and Inter-Layer Dielectric (ILD) 58 are then formed to cover the source/drain regions and the dummy gate stack. The dummy gate stack is then etched to re-expose protruding semiconductor fins 44. Gate stack 52, which includes gate dielectric 48 and gate electrode 50, are then formed in the recess left by the removed dummy gate stack.

The embodiments of the present disclosure have some advantageous features. Conventional STI formation uses flowable CVD, which is unable to form conformal dielectric layers, and hence dummy dielectric fins cannot be formed.

In accordance with some embodiments of the present disclosure, an ALD process is used to form a carbon-and-nitrogen doped film, which is then annealed to form a silicon oxide film. The seam and voids that are generated during the ALD process is eliminated through a sequence of a low-temperature wet anneal process, a high-temperature wet anneal process, and a dry anneal process.

In accordance with some embodiments of the present disclosure, a method includes etching a semiconductor substrate to form a trench; depositing a dielectric layer using an ALD cycle, wherein the dielectric layer extends into the trench, and wherein the ALD cycle comprises pulsing HCD to the semiconductor substrate; purging the HCD; pulsing triethylamine to the semiconductor substrate; and purging the triethylamine; and performing an anneal process on the dielectric layer. In an embodiment, the ALD cycle further includes, after the triethylamine is purged, pulsing oxygen ($O_2$) to the semiconductor substrate; and purging the oxygen. In an embodiment, the method further comprises repeating the ALD cycle that comprising the pulsing oxygen. In an embodiment, the method further comprises repeating the ALD cycle. In an embodiment, the anneal process includes a low-temperature anneal process performed at a first temperature; a high-temperature anneal process performed at a second temperature higher than the first temperature; and a dry anneal process performed at a third temperature higher than the first temperature. In an embodiment, the low-temperature anneal process is performed at the first temperature in a range between about 300° C. and about 450° C. In an embodiment, the high-temperature anneal process is performed at the second temperature in a range between about 500° C. and about 650° C. In an embodiment, the dry anneal process is performed at the third temperature in a range between about 500° C. and about 650° C.

In accordance with some embodiments of the present disclosure, a method includes depositing a dielectric layer on a semiconductor strip, wherein the depositing the dielectric layer comprises a cycle, and the cycle comprises: attaching silicon and chlorine atoms to oxygen atoms on the semiconductor strip; replacing the chlorine atoms with nitrogen atoms and alkyl groups; and replacing first portions of the nitrogen atoms and alkyl groups with oxygen atoms; removing second portions of the nitrogen atoms and alkyl groups with OH bonds; and annealing the dielectric layer to form Si—O—Si bonds. In an embodiment, the cycle comprises an Atomic Layer Deposition (ALD) cycle, and the attaching silicon and chlorine atoms comprises pulsing HCD; and purging the HCD. In an embodiment, the cycle comprises an ALD cycle, and the replacing the chlorine atoms includes pulsing triethylamine; and purging the triethylamine. In an embodiment, the cycle comprises an ALD cycle, and the replacing the first portions of the nitrogen atoms and alkyl groups includes pulsing oxygen ($O_2$); and purging the oxygen. In an embodiment, the annealing the dielectric layer comprises driving $H_2O$ molecules into the dielectric layer at a first temperature; replacing the nitrogen atoms and alkyl groups with oxygen atoms and OH molecules at a second temperature higher than the first temperature; and forming the Si—O—Si bonds through a dry anneal process, wherein the dry anneal process is performed at a third temperature higher than the first temperature. In an embodiment, the dielectric layer is formed in a trench, with the semiconductor strip being on a side of the trench, and the method further comprises: forming an additional dielectric region, wherein the semiconductor strip and the additional dielectric region contact opposite sidewalls of a portion of the dielectric layer; etching back the portion of the dielectric layer, wherein a top portion of the semiconductor strip forms a semiconductor fin, and a top portion of the additional dielectric region forms a dummy dielectric fin; and forming a gate stack extending on the semiconductor fin and the additional dielectric region.

In accordance with some embodiments of the present disclosure, integrated circuit structure includes a first semiconductor strip; a dielectric layer comprising silicon oxide, with carbon doped in the silicon oxide, wherein the dielectric layer comprises: a horizontal portion; and a vertical portion connected to an end of the horizontal portion, wherein the vertical portion contacts a sidewall of a lower portion of the first semiconductor strip, wherein a top portion of the first semiconductor strip protrudes higher than a top surface of the vertical portion to form a semiconductor fin; and a gate stack extending on a sidewall and a top surface of the semiconductor fin. In an embodiment, the integrated circuit structure further includes a dielectric region overlapping the horizontal portion, wherein a top portion of the dielectric region protrudes higher than the top surface of the vertical portion to form a dummy dielectric fin, wherein the gate stack further extends on a sidewall and a top surface of the dummy dielectric fin. In an embodiment, the dielectric region and the dielectric layer are formed of different dielectric materials. In an embodiment, the integrated circuit structure further includes an inter-layer dielectric overlapping the dummy dielectric fin. In an embodiment, the vertical portion and the horizontal portion have a same thickness. In an embodiment, the integrated circuit structure further includes a second semiconductor strip; and an additional dielectric layer, wherein the additional dielectric layer is formed of a homogenous dielectric material same as a dielectric material of the dielectric layer, and wherein the additional dielectric layer is free from seams therein.

In accordance with some embodiments of the present disclosure, a method includes forming a first semiconductor strip; depositing a dielectric layer comprising silicon oxide, with carbon doped in the silicon oxide, wherein the dielectric layer comprises: a horizontal portion; and a vertical portion connected to an end of the horizontal portion, wherein the vertical portion contacts a sidewall of a lower portion of the first semiconductor strip, wherein a top portion of the first semiconductor strip protrudes higher than a top surface of the vertical portion to form a semiconductor fin; and forming a gate stack extending on a sidewall and a top surface of the semiconductor fin. In an embodiment, the method further comprises forming a dielectric region overlapping the horizontal portion, wherein a top portion of the dielectric region protrudes higher than the top surface of the vertical portion to form a dummy dielectric fin, wherein the gate stack further extends on a sidewall and a top surface of the dummy dielectric fin. In an embodiment, the dielectric region and the dielectric layer are formed of different dielectric materials. In an embodiment, the method further comprises depositing an inter-layer dielectric overlapping the dummy dielectric fin. In an embodiment, the dielectric layer is deposited using a conformal deposition process. In an embodiment, the method further comprises, after the depositing the dielectric layer and before the forming the gate stack: performing a low-temperature wet anneal process at a first temperature; after the low-temperature wet anneal process, performing a high-temperature wet anneal process at a second temperature higher than the first temperature; and after the high-temperature wet anneal process, performing a dry anneal process performed at a third temperature higher than the first temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a semiconductor substrate to form a trench;
    depositing a dielectric layer using an Atomic Layer Deposition (ALD) cycle, wherein the dielectric layer extends into the trench, and wherein the ALD cycle comprises:
        pulsing Hexachlorodisilane (HCD) to the semiconductor substrate;
        purging the HCD;
        pulsing triethylamine to the semiconductor substrate; and
        purging the triethylamine; and
    performing an anneal process on the dielectric layer, wherein the anneal process comprises:
        a first wet anneal process performed at a first temperature;
        a second wet anneal process performed at a second temperature higher than the first temperature; and
        a dry anneal process performed at a third temperature higher than the first temperature.

2. The method of claim 1, wherein the ALD cycle further comprises:
    after the triethylamine is purged, pulsing oxygen ($O_2$) to the semiconductor substrate; and
    purging the oxygen.

3. The method of claim 2 further comprising repeating the ALD cycle that comprising the pulsing oxygen.

4. The method of claim 1 further comprising repeating the ALD cycle.

5. The method of claim 1, wherein the first wet anneal process is performed at the first temperature in a range between about 300° C. and about 450° C.

6. The method of claim 1, wherein the second wet anneal process is performed at the second temperature in a range between about 500° C. and about 650° C.

7. The method of claim 1, wherein the dry anneal process is performed at the third temperature in a range between about 500° C. and about 650° C.

8. The method of claim 1, wherein the etching the semiconductor substrate further generates a wide trench, and the trench is a narrow trench narrower than the wide trench, and at a time the anneal process is performed, the narrow trench is fully filled, and the wide trench is partially filled, and a portion of the dielectric layer in the wide trench is conformal.

9. A method comprising:
    depositing a dielectric layer on a semiconductor strip, wherein the depositing the dielectric layer comprises a cycle, and the cycle comprises:
        attaching silicon and chlorine atoms to oxygen atoms on the semiconductor strip;
        replacing the chlorine atoms with nitrogen atoms and alkyl groups; and
        replacing first portions of the nitrogen atoms and alkyl groups with oxygen atoms;
    removing second portions of the nitrogen atoms and alkyl groups with OH bonds; and
    annealing the dielectric layer to form Si—O—Si bonds, wherein the annealing the dielectric layer comprises:
        driving $H_2O$ molecules into the dielectric layer at a first temperature;
        replacing the nitrogen atoms and alkyl groups with oxygen atoms and OH molecules at a second temperature higher than the first temperature; and
        forming the Si—O—Si bonds through a dry anneal process, wherein the dry anneal process is performed at a third temperature higher than the first temperature.

10. The method of claim 9, wherein the cycle comprises an Atomic Layer Deposition (ALD) cycle, and the attaching silicon and chlorine atoms comprises:
    pulsing Hexachlorodisilane (HCD); and
    purging the HCD.

11. The method of claim 9, wherein the cycle comprises an Atomic Layer Deposition (ALD) cycle, and the replacing the chlorine atoms comprises:
    pulsing triethylamine; and
    purging the triethylamine.

12. The method of claim 9, wherein the cycle comprises an Atomic Layer Deposition (ALD) cycle, and the replacing the first portions of the nitrogen atoms and alkyl groups comprises:
    pulsing oxygen ($O_2$); and
    purging the oxygen.

13. The method of claim 9, wherein the dielectric layer is formed in a trench, with the semiconductor strip being on a side of the trench, and the method further comprises:
    forming an additional dielectric region, wherein the semiconductor strip and the additional dielectric region contact opposite sidewalls of a portion of the dielectric layer;
    etching back the portion of the dielectric layer, wherein a top portion of the semiconductor strip forms a semiconductor fin, and a top portion of the additional dielectric region forms a dummy dielectric fin; and
    forming a gate stack extending on the semiconductor fin and the additional dielectric region.

14. The method of claim 9, wherein the dielectric layer extends into a narrow trench and a wide trench in the semiconductor substrate, and wherein at a time the annealing the dielectric layer is performed, the narrow trench is fully filled, and the wide trench is partially filled, and a portion of the dielectric layer in the wide trench is conformal.

15. A method comprising:
    forming a first semiconductor strip;
    depositing a dielectric layer comprising silicon oxide, with carbon doped in the silicon oxide, wherein the dielectric layer comprises:
        a horizontal portion; and
        a vertical portion connected to an end of the horizontal portion, wherein the vertical portion contacts a sidewall of a lower portion of the first semiconductor strip, wherein a top portion of the first semiconductor strip protrudes higher than a top surface of the vertical portion to form a semiconductor fin; and
    forming a gate stack extending on a sidewall and a top surface of the semiconductor fin.

16. The method claim 15 further comprising:
forming a dielectric region overlapping the horizontal portion, wherein a top portion of the dielectric region protrudes higher than the top surface of the vertical portion to form a dummy dielectric fin, wherein the gate stack further extends on a sidewall and a top surface of the dummy dielectric fin.

17. The method of claim 16, wherein the dielectric region and the dielectric layer are formed of different dielectric materials.

18. The method of claim 16 further comprising depositing an inter-layer dielectric overlapping the dummy dielectric fin.

19. The method of claim 15, wherein the dielectric layer is deposited using a conformal deposition process.

20. The method of claim 15 further comprising, after the depositing the dielectric layer and before the forming the gate stack:
performing a first wet anneal process at a first temperature;
after the first wet anneal process, performing a second wet anneal process at a second temperature higher than the first temperature; and
after the second wet anneal process, performing a dry anneal process performed at a third temperature higher than the first temperature.

* * * * *